US008772758B2

(12) United States Patent
Hardy et al.

(10) Patent No.: US 8,772,758 B2
(45) Date of Patent: Jul. 8, 2014

(54) SUPPRESSION OF INCLINED DEFECT FORMATION AND INCREASE IN CRITICAL THICKNESS BY SILICON DOPING ON NON-C-PLANE (AL,GA,IN)N (75) Inventors: Matthew T. Hardy, Goleta, CA (US); Po Shan Hsu, Arcadia, CA (US); Steven P. DenBaars, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 80 days.

(21) Appl. No.: 13/470,598

(22) Filed: May 14, 2012

(65) Prior Publication Data

US 2012/0286241 A1 Nov. 15, 2012

Related U.S. Application Data (60) Provisional application No. 61/486,097, filed on May 13, 2011.

(51) Int. Cl.
*H01L 29/06* (2006.01)

(52) U.S. Cl.
USPC .......................................................... 257/14

(58) Field of Classification Search
USPC ........................ 257/76–103, 13, 14
See application file for complete search history.

(56) References Cited

U.S. PATENT DOCUMENTS

| | | |
|---|---|---|
| 2004/0129200 A1 | 7/2004 | Kouvetakis et al. |
| 2007/0000330 A1 | 1/2007 | Tysoe et al. |
| 2007/0054465 A1 | 3/2007 | Currie et al. |
| 2008/0142781 A1 | 6/2008 | Lee |
| 2009/0072252 A1 | 3/2009 | Son et al. |
| 2009/0081857 A1* | 3/2009 | Hanser et al. ............... 438/507 |
| 2009/0184342 A1* | 7/2009 | Iza et al. ..................... 257/201 |
| 2009/0238227 A1 | 9/2009 | Kubota et al. |
| 2010/0219416 A1 | 9/2010 | Farrell et al. |
| 2011/0006307 A1 | 1/2011 | Chen et al. |
| 2011/0064103 A1 | 3/2011 | Ohta et al. |

OTHER PUBLICATIONS

Matthews et al., "Defects in Epitaxial Multilayers". Journal of Crystal Growth, vol. 32, (1976), pp. 265-273.
Preuss, "Research Hastens Day of Large-Scale Solid-State Light Sources". Science Beat, Berkeley Lab, Aug. 11, 2000. Retrieved from the website, URL http://www.lbl.gov/Science-Articles/Archive/blue-light-diodes.html, on Aug. 21, 2012.

(Continued)

*Primary Examiner* — Brook Kebede
(74) *Attorney, Agent, or Firm* — Gates & Cooper LLP (57) ABSTRACT A method for fabricating a III-nitride based semiconductor device, including (a) growing one or more buffer layers on or above a semi-polar or non-polar GaN substrate, wherein the buffer layers are semi-polar or non-polar III-nitride buffer layers; and (b) doping the buffer layers so that a number of crystal defects in III-nitride device layers formed on or above the doped buffer layers is not higher than a number of crystal defects in III-nitride device layers formed on or above one or more undoped buffer layers. The doping can reduce or prevent formation of misfit dislocation lines and additional threading dislocations. The thickness and/or composition of the buffer layers can be such that the buffer layers have a thickness near or greater than their critical thickness for relaxation. In addition, one or more (AlInGaN) or III-nitride device layers can be formed on or above the buffer layers.

32 Claims, 4 Drawing Sheets

(56) References Cited

OTHER PUBLICATIONS

Tyagi et al., "Partial strain relaxation via misfit dislocation generation at heterointerfaces in (Al,In)GaN epitaxial layers grown on semipolar (1122) GaN free standing substrates". Applied Physics Letters, vol. 95, (2009), pp. 251905.

Young et al., "Critical Thickness for Onset of Plastic Relaxation in (1122) and (2021) Semipolar AlGaN Heterostructures". Applies Physics Express, vol. 3 (2010), pp. 111002.

International Search Report and Written Opinion of the International Searching Authority for application No. PCT/US12/37728 mailed on Aug. 14, 2012.

\* cited by examiner

SUPPRESSION OF INCLINED DEFECT FORMATION AND INCREASE IN CRITICAL THICKNESS BY SILICON DOPING ON NON-C-PLANE (AL,GA,IN)N

CROSS REFERENCE TO RELATED APPLICATIONS

This application claims the benefit under 35 U.S.C. Section 119(e) of and commonly-assigned U.S. Provisional Patent Application Ser. No. 61/486,097, filed on May 13, 2011, by Matthew T. Hardy, Po Shan Hsu, Steven P. DenBaars, James S. Speck, and Shuji Nakamura, entitled "SUPPRESSION OF INCLINED DEFECT FORMATION AND INCREASE IN CRITICAL THICKNESS BY SILICON DOPING ON NON-C-PLANE (Al,Ga,In)N,", which application is incorporated by reference herein.

This application is related to the following co-pending and commonly-assigned applications:

U.S. Utility application Ser. No. 12/861,532, filed on Aug. 23, 2010, now U.S. Pat. No. 8,481,991, issued on Jul. 9, 2013, by Hiroaki Ohta, Feng Wu, Anurag Tyagi, Arpan Chakraborty, James S. Speck, Steven P. DenBaars, Shuji Nakamura, and Erin C. Young, entitled "SEMIPOLAR NITRIDE-BASED DEVICES ON PARTIALLY OR FULLY RELAXED ALLOYS WITH MISFIT DISLOCATIONS AT THE HETEROINTERFACE,", which application claims the benefit under 35 U.S.C. Section 119(e) of U.S. Provisional Application Ser. No. 61/236,058, filed on Aug. 21, 2009, by Hiroaki Ohta, Feng Wu, Anurag Tyagi, Arpan Chakraborty, James S. Speck, Steven P. DenBaars, and Shuji Nakamura, entitled "SEMIPOLAR NITRIDE-BASED DEVICES ON PARTIALLY OR FULLY RELAXED ALLOYS WITH MISFIT DISLOCATIONS AT THE HETEROINTERFACE,";

U.S. Utility application Ser. No. 12/861,652, filed on Aug. 23, 2010, by Hiroaki Ohta, Feng Wu, Anurag Tyagi, Arpan Chakraborty, James S. Speck, Steven P. DenBaars, Shuji Nakamura, and Erin C. Young, entitled "ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS,", which application claims the benefit under 35 U.S.C. Section 119(e) of U.S. Provisional Application Ser. No. 61/236,059, filed on Aug. 21, 2009 by Hiroaki Ohta, Feng Wu, Anurag Tyagi, Arpan Chakraborty, James S. Speck, Steven P. DenBaars, and Shuji Nakamura, entitled "ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS,";

U.S. Utility application Ser. No. 12/284,449 filed on Oct. 28, 2011, by Matthew T. Hardy, Steven P. DenBaars, James S. Speck, and Shuji Nakamura, entitled "STRAIN COMPENSATED SHORT-PERIOD SUPERLATTICES ON SEMIPOLAR GAN FOR DEFECT REDUCTION AND STRESS ENGINEERING,", which application claims the benefit under 35 U.S.C. Section 119(e) of co-pending and commonly-assigned U.S. Provisional Application Ser. No. 61/408,280 filed on Oct. 29, 2010, by Matthew T. Hardy, Steven P. DenBaars, James S. Speck, and Shuji Nakamura, entitled "STRAIN COMPENSATED SHORT-PERIOD SUPERLATTICES ON SEMIPOLAR GAN FOR DEFECT REDUCTION AND STRESS ENGINEERING,"; and U.S. Provisional Application Ser. No. 61/550,874, filed Oct. 24, 2011, by Po Shan Hsu, Matthew T. Hardy, Steven P. DenBaars, James S. Speck, and Shuji Nakamura, entitled "NONPOLAR/SEMIPOLAR (AL,IN,B,GA)N LASERS WITH STRESS RELAXATION AT THE P-CLADDING/P-WAVEGUIDING AND N-CLADDING/N-WAVEGUIDING HETEROINTERFACES,";

all of which applications are incorporated by reference herein.

BACKGROUND OF THE INVENTION

1. Field of the Invention

The invention is related generally to the field of electronic and optoelectronic devices, and more particularly, to suppression of inclined defect formation and increase of critical thickness by Silicon (Si) doping on non-c-plane (Al,Ga,In)N.

2. Description of the Related Art (Note: This application references a number of different publications as indicated throughout the specification by one or more reference numbers within brackets, e.g., [Ref. X]. A list of these different publications ordered according to these reference numbers can be found below in the section entitled "References." Each of these publications is incorporated by reference herein.)

Despite recent progress, the performance of green light emitting diodes (LEDs) and laser diodes (LDs) is much lower than equivalent devices emitting in blue or violet regimes. Active regions operating in the green regime require Indium (In) compositions in the quantum wells (QWs) of around 30%. Due to the large lattice mismatch between InN and GaN of around 10%, such structures must be grown at very high strain, e.g., 3% for $In_{0.3}Ga_{0.7}N$, thereby degrading crystal quality and leading to large piezoelectric induced electric fields in the quantum wells. Stress relaxation also limits the composition and thickness of InGaN waveguiding layers in LDs [Ref. 1].

For traditional planar c-plane and nonpolar strained heteroepitaxy, stress relaxation typically does not occur via slip due to the absences of resolved shear stress on the c-plane, which is the most favorable slip system. However, c-plane slip has been observed on (20-21) and (11-22) semipolar orientations, which have significant resolved shear stress on the c-plane [Ref 2].

An available stress relaxation mechanism which preserves the crystal quality of overlying layers opens up the possibility of growing relaxed InGaN buffers. Aside from reducing active region strain during growth, an InGaN virtual substrate would open up device design space by allowing for tensile strained or unstrained InGaN barriers to reduce band offsets, reduced piezoelectric polarization in the QWs, and increased critical thickness for InGaN waveguiding layers. Moreover, c-plane slip can only relieve stress parallel to the c-plane, and at higher layer thicknesses and compositions, the stress in the orthogonal direction will eventually lead to relaxation by another mechanism.

AlGaN films can relieve this strain via cracking, but this mechanism is not available in InGaN due the compressive nature of the epi-strain. At thicknesses sufficiently beyond the critical thickness, dark lines are observed inclined with respect to the c-direction. For (20-21) InGaN, these lines are parallel to the intersection of the growth plane with inclined m-planes, and in (11-22) InGaN, lines have been observed parallel to the intersection of the growth plane and inclined m- and a-planes. These lines are likely misfit dislocations (MDs) formed by slip on the inclined m-planes and/or a-planes.

Figure 1:
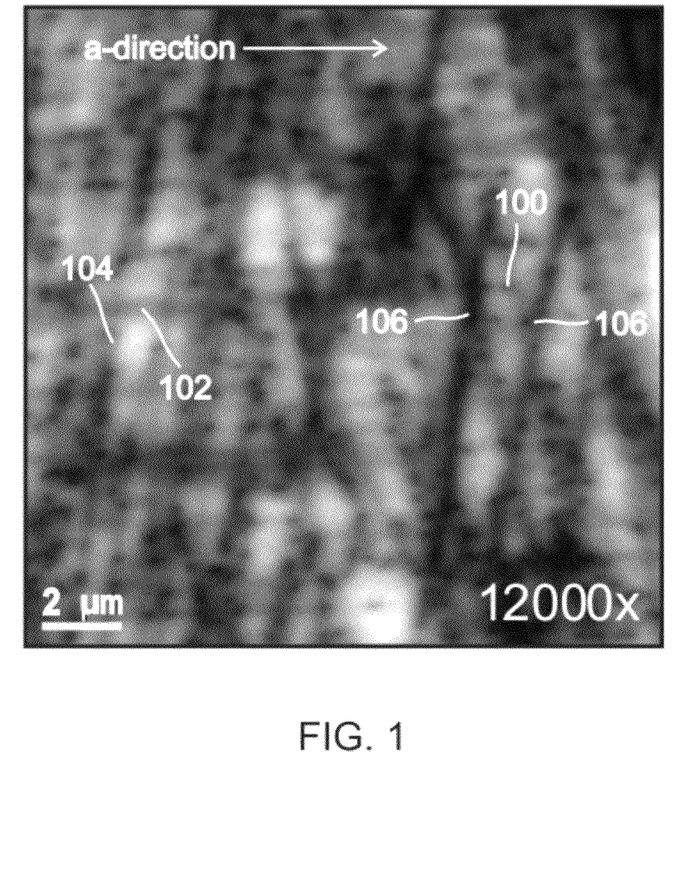
FIG. 1 is a cathodoluminescence (CL) image of 500 nm of $In_{0.03}Ga_{0.97}N$ on a (20-21) GaN substrate, wherein the scale is 2 micrometers (μm) and the magnification is 12000.

FIG. 1 is a cathodoluminescence (CL) image of 500 nanometers (nm) of $In_{0.03}Ga_{0.97}N$ on a (20-21) GaN substrate, showing dark dots 100, and wherein c-plane and m-plane slip lines 102, 104, respectively, are visible in the background, and m-plane slip lines 106 are visible in the foreground. In FIG. 1, inclined lines 104, 106 are at an angle less than 90° with respect to the in-plane a-direction, and line 102 is parallel to the a-direction. As shown in FIG. 1, interaction between the misfit dislocation lines from c-plane and m-plane slip leads to threading dislocation (TD) multiplication, as seen by the dark dots 100 decorating the inclined lines 104, 106. The dark dots 100 at the intersection of the c-plane and m-plane slip lines are newly formed TDs with a density greater than $1 \times 10^8$ cm$^{-2}$, wherein substrate TD densities are on the order of $0.5-1 \times 10^7$ cm$^{-2}$.

Once formed, TDs are very difficult to remove and have deleterious consequences for subsequently grown devices, in contrast to the misfit dislocation lines formed by slip, which can easily be buried far from the active region and have negligible impact on device performance. Thus, avoiding TD formation is highly desired and critical to achieving improved device performance using relaxed buffer layers.

Thus, there is a need in the art for improved methods for preventing the formation of additional TDs. The present invention satisfies this need. Specifically, the present invention shows the impact of Si doping on defect morphology and prevention of additional TD formation.

SUMMARY OF THE INVENTION

To overcome the limitations in the prior art described above, and to overcome other limitations that will become apparent upon reading and understanding the present specification, the present invention discloses a method for fabricating a III-nitride based semiconductor device, comprising (a) growing one or more buffer layers on or above a semi-polar or non-polar GaN substrate, wherein the buffer layers are semi-polar or non-polar III-nitride buffer layers; and (b) doping the buffer layers so that a number of crystal defects in III-nitride device layers formed on or above the doped buffer layers is not higher than a number of crystal defects in III-nitride device layers formed on or above one or more undoped buffer layers.

The buffer layers can comprise InGaN, AlGaN, or GaN for example.

The buffer layers can be doped with a doping concentration of more than $3 \times 10^{18}$ cm$^{-3}$. The buffer layers can be doped with Silicon (Si).

The method can further comprise forming one or more III-nitride device layers on or above and/or below the buffer layers. The III-nitride device layers can be coherently grown on or above the doped buffer layers. One or more of the III-nitride device layers formed on or above the doped buffer layers, including an active region, can have a threading dislocation density of $10^7$ cm$^{-2}$ or less. An indium composition of one or more of the III-nitride device layers formed on or above the doped buffer layers, including the active region, can be at least 30%, or sufficient for the device to emit light having a peak intensity at a wavelength in a green wavelength range or longer. The III-nitride device layers formed on or above the doped buffer layers can comprise one or more waveguiding layers and/or one or more cladding layers.

The doping can reduce or prevent formation of misfit dislocation lines, including additional threading dislocations, e.g., parallel to inclined m-plane or a-plane directions.

The doping can reduce or prevent formation of misfit dislocations with line directions inclined with respect to an in-plane m- or a-direction of the III-nitride device layers formed on or above the doped buffer layers. The doping can prevent formation of threading dislocations (e.g., additional threading dislocations) during growth of the buffer layers and/or the III-nitride device layers on or above the doped buffer layers. The doping can reduce or prevent formation of misfit dislocation lines resulting from c-plane slip where the line direction is parallel to an in-plane m- or a-direction of the III-nitride device layers formed on or above the doped buffer layers.

The doping of the buffer layer (e.g., GaN buffer layer) with Si can influence or control extended defect morphology.

The doping and/or thickness and/or composition of the doped buffer layers can be such that the doped buffer layers have a thickness near or greater than their critical thickness for relaxation. The thickness or composition of the (In,Al)GaN layers can be such that the (In,Al)GaN layers are near or greater than their critical thickness for relaxation.

The method can further comprise increasing or maximizing a critical thickness of the buffer layers by the doping, or wherein the doping is such that the critical thickness is thicker as compared to without the doping.

The present invention also encompasses a device fabricated according to this method.

The present invention further discloses a III-nitride based semiconductor device structure, comprising one or more buffer layers on or above a semi-polar or non-polar GaN substrate, wherein the buffer layers are semi-polar or non-polar III-nitride buffer layers, and a doping concentration in the buffer layers is optimized such that a number of crystal defects in III-nitride device layers formed on or above the doped buffer layers is not higher than a number of crystal defects in III-nitride device layers formed on or above one or more undoped buffer layers.

The present invention can be used to fabricate optoelectronic (LEDs, LDs) or electronic devices such as a transistor or High Electron Mobility Transistor (HEMT), or solar cells.

BRIEF DESCRIPTION OF THE DRAWINGS

Referring now to the drawings in which like reference numbers represent corresponding parts throughout:

FIG. 2(*a*) is a schematic of a sample epitaxial structure, and FIGS. 2(*b*)-(*i*) are a series of CL images showing defect morphology for the structure, wherein the scale is 20 μm in FIGS. 2(*b*)-(*e*) and 10 micrometers (μm) in FIGS. 2(*f*)-(*i*).

FIGS. 3(*a*)-(*c*) are example epitaxial structures, wherein the layer doped with Si, to control the misfit dislocation morphology, is indicated with angled lines.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

As noted above, relaxation on semipolar GaN occurs initially by slip on the c-plane [Ref 2]. As the layer composition and thickness move farther beyond the critical thickness, relaxation in the orthogonal direction begins to occur by slip on the inclined m-planes, as seen in FIG. 1. The interaction of the two interaction mechanisms leads to the generation of additional TDs, which have deleterious effects on any devices grown on top of this relaxed buffer layer (see, e.g., the cross-referenced applications set forth above and Ref. 1)

The present invention uses controlled Si doping to suppress the onset of m-plane slip, thereby preventing the formation of additional TDs. It has also been observed that Si doping reduces the degree of relaxation, which suggests that Si doping may be used for films grown near the critical thickness to suppress the onset of relaxation.

The present invention can be used to help realize a relaxed buffer layer on semipolar (SP) GaN with low TD density. Such a layer can provide an InGaN/AlGaN pseudo-substrate, allowing reduction in the strain during growth of subsequent InGaN/AlGaN layers. Reduced strain in quantum wells (QWs) may result in higher internal quantum efficiencies in (1) green active regions, due to reduced defect density during growth on InGaN relaxed buffers, or (2) Ultraviolet (UV) active regions (due to reduced defect density during growth on AlGaN relaxed buffers), for LEDs, LDs, and solar cells. Additionally, a decrease in strain will lead to higher critical thicknesses for waveguiding layers (i.e., InGaN waveguiding layers on an InGaN buffer layer).

InGaN-based SP LDs can tolerate some relaxation in the n-InGaN waveguide, as long as it occurs via c-plane slip. The appearance of m-plane slip and subsequent TD formation causes a rapid deterioration of active region quality. In this case, elevated Si doping would prevent m-plane slip and preserve the active region quality.

The addition of Si suppresses the onset of relaxation via slip, allowing n-InGaN waveguiding layers to be grown farther beyond their critical thickness. This would improve the confinement factor without creating additional defects near the active region.

The present invention has experimentally demonstrated suppression of m-plane and a-plane slip for InGaN growth on (20-21) and (11-22) semipolar planes. The present invention is also applicable to growth of AlGaN doped with Silicon (AlGaN:Si).

The present invention demonstrates high quality relaxed buffer layers that can be used to enhance device performance. Relaxed buffer layers employing the present invention can be used to make higher performance devices, including LEDs, LDs and solar cells. LDs with higher confinement factors, due to coherently grown n-InGaN waveguiding layers, would have lower threshold current densities, and thus lower operating current and voltage.

Technical Description

FIG. 2(a) is a schematic of a sample epitaxial structure 200 according to an example of the present invention. The sample epitaxial structure includes a (20-21) or (11-22) GaN substrate 202 and an $In_{0.06}Ga_{0.94}N$ layer 204 (having a thickness 206) grown on the (20-21) or (11-22) GaN substrate 202.

A series of samples were grown using horizontal flow Metal Organic Chemical Vapor Deposition (MOCVD) on (20-21) free standing GaN substrates 202. The composition was fixed at $In_{0.06}Ga_{0.94}N$ to grow layer 204 with a thickness 206 of 225 nm, and a $Si_2H_6$ flow rate was varied among 0, 0.4, 1 and 2 standard cubic centimeters per minute (sccm), corresponding roughly to doping levels of 0, $3 \times 10^{18}$ cm$^{-3}$, $7 \times 10^{18}$ cm$^{-3}$, and $2 \times 10^{19}$ cm$^{-3}$, in the $In_{0.06}Ga_{0.94}N$ layer 204, respectively. A sample with an undoped (0 sccm) $In_{0.06}Ga_{0.94}N$ layer 204 was grown to a thickness 206 of 200 nm, instead of a thickness 206 of 225 nm as for the remainder of the series, and should, if anything, show reduced signs of relaxation, as compared to the remaining samples, based on thickness 206 alone.

Figure 2:
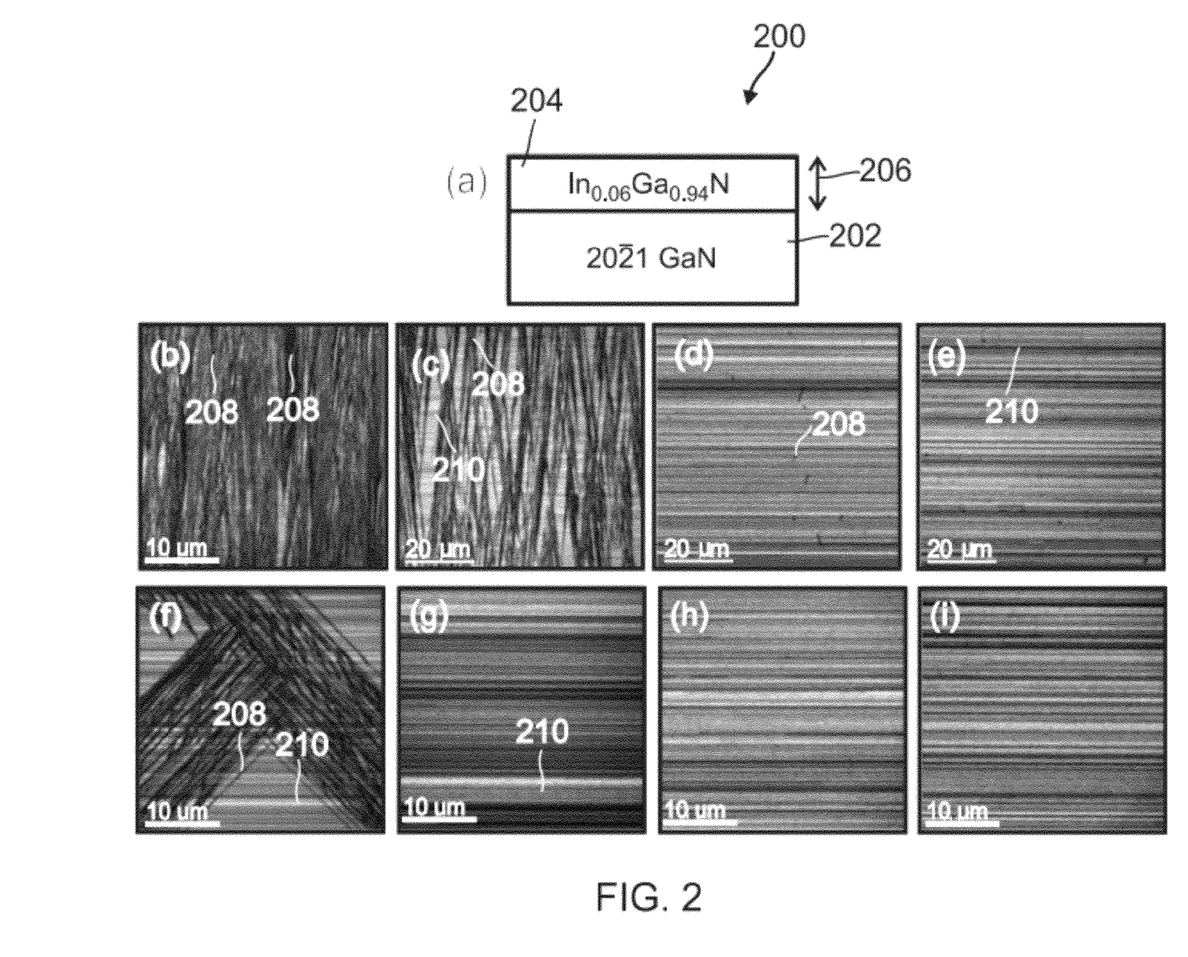

FIGS. 2(b)-(i) are a series of CL images showing the defect morphology on 200 nm thick 206 (20-21) InGaN 204 for: in FIG. 2(b), no Si doping; in FIG. 2(c), 0.4 sccm $Si_2H_6$ flow rate (~$3 \times 10^{18}$ cm$^{-3}$ doping level); in FIG. 2(d), 1 sccm flow rate (~$7 \times 10^{18}$ cm$^{-3}$ doping level); and in FIG. 2(e), 2 sccm flow rate (~$2 \times 10^{19}$ cm$^{-3}$ doping level); and on 200 nm thick (11-22) InGaN for: in FIG. 2(f), no Si doping; in FIG. 2(g), 1 sccm $Si_2H_6$ flow rate; in FIG. 2(h), 2 sccm $Si_2H_6$ flow rate; and in FIG. 2(i), 3 sccm $Si_2H_6$ flow rate.

As shown in FIGS. 2(b)-(i), there is a strong impact of Si doping level on the defect morphology. With no doping, there is a very high density of inclined m-plane slip lines 208, such that it is difficult to see the c-plane slip lines that form first on (20-21). With 0.4 sccm Si flow, the density of m-plane slip lines has been greatly reduced, such that there are only a few discrete lines visible, along with the c-plane slip 210. For 1 sccm flow, there is only a single short m-plane segment 208 visible, and at 2 sccm flow, there is only c-plane slip 210 remaining.

Si doped InGaN samples were characterized using on-axis reciprocal space mapping (RSM). This technique uses the measured macroscopic tilt of the epilayer relative to the substrate to calculate plastic strain, degree of relaxation (DoR), and composition. Equivalent InGaN composition ($InGaN_{eq}$) is used to compare the total relaxation of films with different compositions, and is given by $InGaN_{eq} = DoR \cdot x$, wherein x is the percentage of InN in the InGaN, and corresponds to the composition of the "virtual substrate" created by the relaxed InGaN layer.

The results given in Table 1 below show that the addition of Si allows $InGaN_{eq}$ values equal to or greater than films without Si, while preventing inclined defect formation. There is some scatter in the data due to run-to-run reproducibility issues, measurement error, and substrate dependant variations in the grown-in defect density. In Table 1, x corresponds to the percentage of indium in the composition and X indicates the presence of inclined defects. While the mechanism is unclear, it is possible that Si is influencing the Peierls forces in the secondary m-plane/a-plane slip system and delaying relaxation in these systems. The Si doping may also influence the Peierls forces in the primary c-plane slip system and reduce the overall DoR. Alternatively, n-doping may change the Fermi level in the relaxed buffer layer, which may, in turn, increase the Fermi level dependent formation energy of misfit dislocations. In either case, the addition of Si may serve to hinder slip on the c-plane, while providing a larger barrier to slip on the inclined m-plane and a-plane. If a fully coherent structure is desired, high Si doping may also prove to increase the critical thickness for the onset of any relaxation.

TABLE 1

Relaxation results measured from epilayer tilt using RSM measurements

| $Si_2H_6$ flow (sccm) | Thickness (nm) | x (%) | $InGaN_{eq}$ (%) | Inclined Defects[a] |
|---|---|---|---|---|
| 20-21 | | | | |
| 0 | 185 | 6.0 | 1.8 | X |
| 0.4 | 185 | 6.3 | 1.6 | X |
| 1 | 185 | 6.2 | 0.46 | — |
| 2 | 185 | 6.3 | 0.96 | — |
| 2 | 185 | 8.9 | 4.3 | X |
| 3 | 185 | 8.0 | 2.2 | — |
| 3 | 185 | 9.1 | 4.3 | slight x |
| 4 | 185 | 9 | 3.4 | slight x |
| 0 | 200 | 7.1 | 3.0 | X |

TABLE 1-continued

Relaxation results measured from epilayer tilt using RSM measurements

| $Si_2H_6$ flow (sccm) | Thickness (nm) | x (%) | $InGaN_{eq}$ (%) | Inclined Defects[a] |
|---|---|---|---|---|
| 0.4 | 225 | 7.1 | 3.3 | X |
| 1 | 225 | 9.0 | 3.4 | — |
| 2 | 225 | 6.3 | 1.4 | — |
| | 11-22 | | | |
| 0 | 200 | 6 | | X |
| 1 | 200 | 5.9 | 1.8 | — |
| 2 | 200 | 5.5 | 1.4 | — |
| 3 | 200 | 5.7 | 3.9 | — |
| 4 | 200 | 5.5 | 2.0 | — |
| 3 | 300 | 5.7 | 1.5 | — |

[a]"X" indicates the presence of inclined defects, including those resulting from m-plane or a-plane slip.

The present invention's technology will allow much higher degree of relaxation to be achieved on SP GaN, without additional TD generation. In the simplest case, a single or graded buffer layer could be grown with sufficient Si doping to completely suppress m-plane and a-plane slip. A full LD, LED, solar cell or other device structure could then be grown on the pseudo-substrate with reduced epitaxial strain in one direction. Alternatively, the relaxed, Si doped layer could be used as the n-waveguiding layer in a more conventional LD structure.

Device Structures

Figure 3:
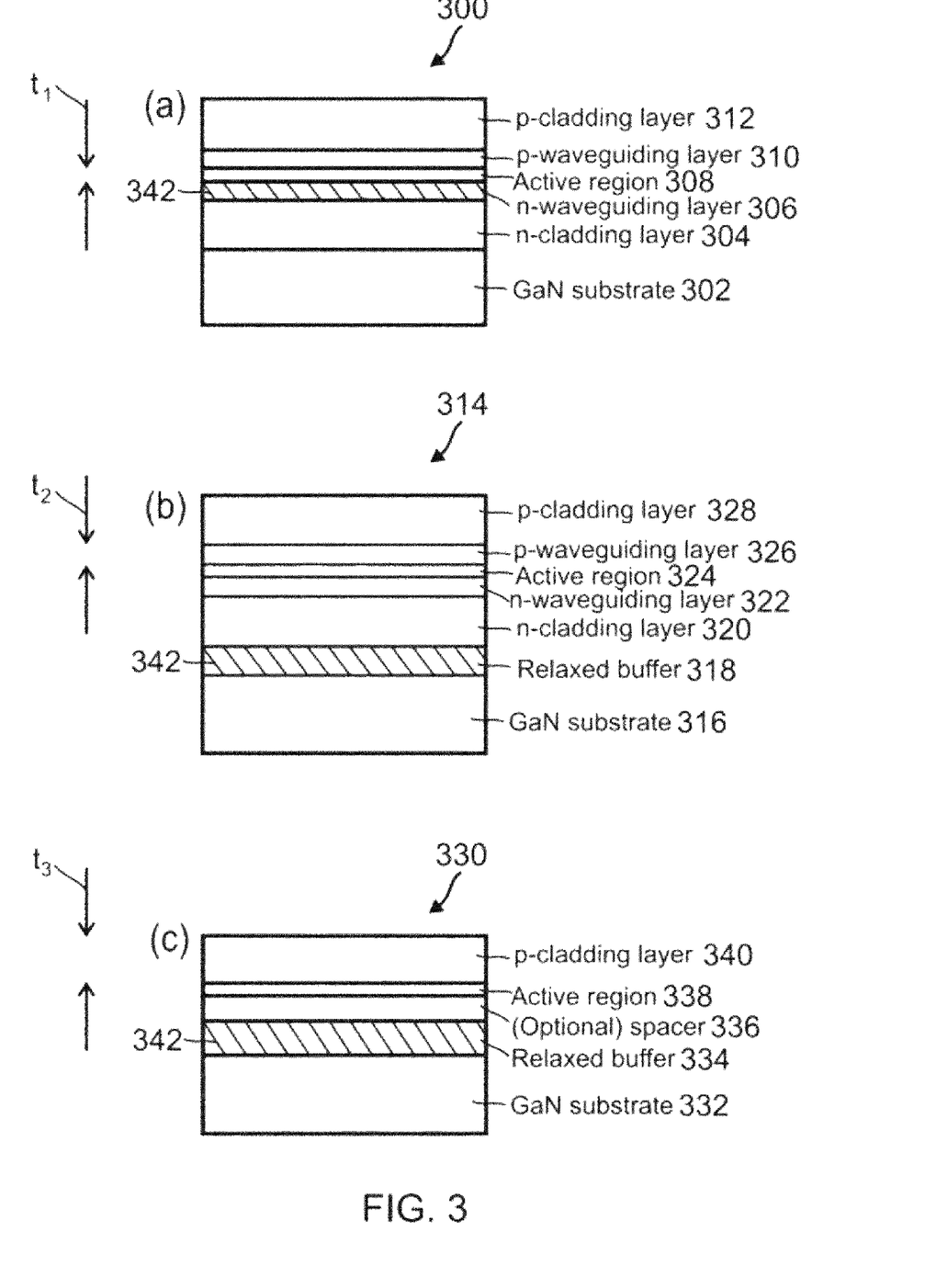

FIGS. 3(a)-(c) are examples of epitaxial structures according to one or more examples of the present invention. FIG. 3(a) is a LD structure 300 comprised of a GaN substrate 302, an n-type cladding (n-cladding) layer 304, an n-type waveguiding (n-waveguiding) 306 layer, an active region 308, a p-type waveguiding (p-waveguiding) layer 310, and a p-type cladding (p-cladding) layer 312, wherein the n-waveguiding layer 306 is a relaxed n-waveguiding layer 306.

FIG. 3(b) is an LD structure 314 comprised of a GaN substrate 316, a buffer layer 318, an n-cladding layer 320, an n-waveguiding layer 322, an active region 324, a p-waveguiding layer 326, and a p-cladding layer 328, wherein the buffer layer 318 is a relaxed buffer layer 318.

FIG. 3(c) is a LED or solar cell structure 330 comprised of a GaN substrate 332, a buffer layer 334, an (optional) spacer layer 336, an active region 338, and a p-cladding layer 340, wherein the buffer layer 334 is a relaxed buffer layer 334. In each case, the layer doped with Si to control the misfit dislocation morphology is shown with angled lines 342, i.e., the n-waveguiding layer 306 in FIG. 3(a), the relaxed buffer layer 318 in FIG. 3(b), and the relaxed buffer layer 334 in FIG. 3(c). The layers 306, 318, and 334 have the doping with Silicon according to the present invention, in order to control extended defect morphology in the device structures 300, 314, and 330.

In the case of fully coherent structures, higher Si doping can allow the realization of higher critical thicknesses. This would allow LDs grown with thicker or higher composition n-InGaN waveguiding layers 306, providing increased optical confinement and allowing the fabrication of devices with lower threshold current densities and lower operating currents and voltages.

Possible Modifications and Variations

The devices 300, 314, 330 can be semipolar or nonpolar devices. The substrates 302, 316, and 332 can be semipolar or nonpolar substrates. The device layers 304-312, 318-328, and 334-340 can be semipolar or nonpolar layers, or have a semipolar or nonpolar orientation (e.g., layers 304-312, 318-328 can grown on or above each other and/or on or above the semipolar or nonpolar planes of the substrate 302, 316, 332).

The active layers 308, 324, 338 can emit or absorb light (or electromagnetic radiation) having a peak intensity at a wavelength in a green wavelength range or longer (e.g., red or yellow light), or a peak intensity at a wavelength of 500 nm or longer. However, the present invention is not limited to devices 300, 314, 330 emitting or absorbing at particular wavelengths, and the devices 300, 314, 330 can emit or absorb at other wavelengths. For example, the present invention is applicable to ultraviolet, blue, yellow, and red light emitting devices 300, 314 or solar cells 330.

The active layers 308, 324, 338 can have a thickness $t_1$ sufficiently thick, and have sufficiently high Indium composition, such that the light emitting device emits, or the solar cell absorbs, the light having the desired wavelengths.

The light emitting or absorbing active layer(s) 308, 324, 338 can include Indium containing layers, such as InGaN layers (e.g., one or more InGaN quantum wells with GaN barriers). The InGaN quantum wells can have an Indium composition of at least 7%, at least 10%, at least 16%, or at least 30%, and a thickness or well width greater than 4 nanometers, e.g., 5 nm, at least 5 nm, or at least 8 nm. However, the quantum well thickness can also be less than 4 nm, although it is typically above 2 nm thickness.

The waveguiding layers 306, 310, 322, 326 can comprise indium containing layers such as one or more InGaN quantum wells with GaN barrier layers (e.g., Indium content of at least 30%). The cladding layers 304, 312, 340 can comprise AlGaN and/or GaN layers, for example.

The III-nitride device layers 304-312, 318-328, and 334-340 can comprise layers that are coherently grown, non-coherently grown, or that are partially or fully relaxed. For a layer X grown on a layer Y, for the case of coherent growth, the in-plane lattice constant(s) of X are constrained to be the same as the underlying layer Y. If X is fully relaxed, then the lattice constants of X assume their natural (i.e. in the absence of any strain) value. If X is neither coherent nor fully relaxed with respect to Y, then it is considered to be partially relaxed. In some cases, the substrate might have some residual strain.

The equilibrium critical thickness corresponds to the case when it is energetically favorable to form one misfit dislocation at the layer/substrate interface.

Experimental, or kinetic critical thickness, is always somewhat or significantly larger than the equilibrium critical thickness. However, regardless of whether the critical thickness is the equilibrium or kinetic critical thickness, the critical thickness corresponds to the thickness where a layer transforms from fully coherent to partially relaxed.

Another example of critical thickness is the Matthews Blakeslee critical thickness [3].

One or more of the device layers (e.g., 304-312, 318-328, and 334-340) can have a thickness that is high enough and/or composition, such that a film, comprising all or one or more of the device layers, has a thickness near or greater than the film's critical thickness for relaxation.

One or more of the III-nitride device layers (e.g., 304-312, 318-328, and 334-340) can be thicker, and/or have a higher alloy composition (e.g., more Al, In, and/or B, or non-gallium element), as compared to III-nitride device layers without the doped buffer layer 306, 318, 334.

For example, a total thickness $t_1$ of all the active layers e.g., 308, 324, 338 (e.g., multi-quantum-well stack thickness) can be equal to, or greater than, the critical thickness of a similar active layer grown in a structure without the doped buffer layer 306, 318, 334 of the present invention (e.g., equal to or greater than the critical thickness of a similar active layer grown directly on a GaN layer/substrate/lattice mismatched layer or on an undoped buffer layer).

For example, a total thickness $t_2$ of the n-type waveguiding layers (or p-type waveguiding layers) can be equal to, or greater than, the critical thickness of similar n-type waveguiding layers (or similar p-type waveguiding layers) grown in a structure without the doped buffer layer 306, 318, 334 of the present invention (e.g., equal to or greater than the critical thickness of similar waveguiding layers grown directly on a GaN layer/substrate/lattice mismatched layer or on an undoped buffer layer).

For example, a total thickness $t_3$ of the n-type cladding layers (or p-type cladding layers) can be equal to, or greater than, the critical thickness for similar n-type cladding layers (or similar p-type cladding layers) grown in a structure without the doped buffer layer of the present invention (e.g., equal to or greater than the critical thickness of similar cladding layers grown directly on a GaN layer/substrate/lattice mismatched layer or on an undoped buffer layer).

The achievable thickness of a layer depends on its strain relative to the buffer layer on which it is grown. For the case of alloys grown on GaN, the strain is determined by the alloy composition. For example, in undoped $In_xGa_{1-x}N$ films with x=8%, m-plane slip can be observed as early as 60 nm thickness. With ~$3 \times 10^{19}$ cm$^{-3}$ Si doping, m-plane slip is not observed even at 185 nm thickness. In this case, in terms of the Matthews-Blakeslee critical thickness $h_c$, m-plane slip occurred at ~$2h_c$ without Si doping and at greater than $6h_c$ with high Si doping. The onset of c-plane slip in this composition regime is often around $1.5h_c$. Calculations for the theoretical Matthews-Blakeslee $h_c$ can be found in [Ref. 2].

Process Steps

Figure 4:
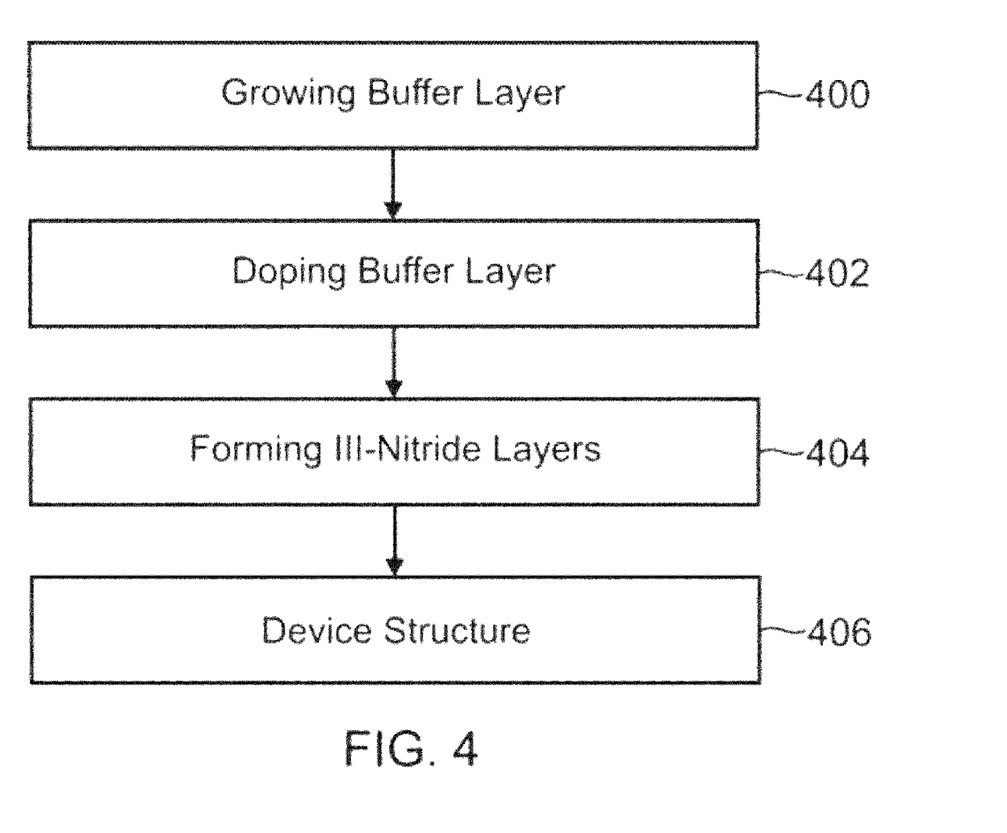
FIG. 4 is a flowchart illustrating a method of fabricating a device structure.

FIG. 4 illustrates a method for fabricating an (AlInGaN) or III-nitride based semiconductor device. The method may comprise the following steps.

Block 400 represents growing one or more buffer layers, e.g., on or above a semi-polar or non-polar III-nitride or GaN substrate, wherein the buffer layers are semi-polar or non-polar III-nitride or GaN buffer layers.

Block 402 represents doping the buffer layers. The doping (e.g., doping level and dopant) can be so that a number of crystal defects (e.g., extended defects, threading dislocations, stacking faults) in III-nitride device layers formed on or above the doped buffer layers is not higher than a number of crystal defects in III-nitride device layers formed on or above one or more undoped buffer layers. For example, the step can comprise doping a semi-polar or non-polar buffer layer (e.g., GaN buffer layer) to influence or control extended defect morphology.

The buffer layers can be doped with a doping concentration of more than $3 \times 10^{18}$ cm$^{-3}$. The buffer layers can be doped with Silicon (Si).

The doping can reduce or prevent formation of misfit dislocation lines parallel to the inclined m-plane or a-plane directions.

The doping can reduce or prevent formation of misfit dislocations with line directions inclined with respect to an in-plane m- or a-direction of the III-nitride device layers formed on or above the doped buffer layers. The MDs the present invention can prevent here are formed from m-plane or a-plane slip. The MD line direction is the intersection of the slip plane with the growth plane. In this case the line direction is inclined with respect to the in-plane a- or m-direction (depending on the semipolar plane).

The doping can prevent formation of additional threading dislocations during growth of the buffer layers and/or the III-nitride device layers on or above the doped buffer layers.

The doping can reduce or prevent formation of misfit dislocation lines parallel to the c-plane direction.

The doping can reduce or prevent formation of misfit dislocation lines resulting from c-plane slip where the line direction is parallel to an in-plane m- or a-direction of the III-nitride device layers formed on or above the doped buffer layers. The MDs result from c-plane slip and form at the intersection of the c-plane and semipolar plane, which is the a-direction for (20-21) and the m-direction for (11-22).

The buffer layers can comprise GaN, InGaN, AlGaN, or AlInGaN, for example.

The doping and/or thickness and/or composition of the buffer layers can be such that the doped buffer layers have the thickness near or greater than their critical thickness for relaxation.

The doping can increase or maximize a critical thickness of the buffer layer. For example, the doping can be such that the critical thickness is thicker as compared to without the doping.

If the suppression of m-plane slip (and/or c-plane slip) is due to a change in the Fermi level, then any intentional or unintentional n-type dopant will show the same effect. Silicon is the most common intentional dopant, but oxygen is a common unintentional dopant (especially in Al containing layers). Other n-type dopants include Se and Ca. In addition, growth conditions that enhance n-type intrinsic defects, such as nitrogen vacancies may contribute to this effect.

If m-plane slip suppression is due to impurity hardening effects, then any n-type, p-type or non-electrically active impurity can be used, including Mg, Zn, Be, C and many other elements.

Block 404 represents forming (e.g., growing or depositing) one or more (In,Al)GaN or III-nitride layers (e.g., device layers) on or above and/or below the doped buffer layers. The step can comprise forming one or more (AlInGaN) device layers on or above and/or below the (In,Al)GaN layers.

A thickness or composition of the (In,Al)GaN layers can be such that the (In,Al)GaN layers are near or greater than their critical thickness for relaxation.

One or more of the III-nitride device layers formed on or above and/or below the doped buffer layers, including an active region, can have a threading dislocation density of $10^7$ cm$^{-2}$ or less. The III-nitride device layers can be coherently grown on or above the doped buffer layers. An indium composition of one or more of the III-nitride device layers formed on or above and/or below the doped buffer layers, including the active region, can be at least 30% or sufficient for the device to emit light peak intensity at a wavelength in a green wavelength range or longer.

The III-nitride device layers formed on or above and/or below the doped buffer layers can comprise one or more waveguiding layers and/or one or more cladding layers.

Block 406 represents the end result of the method, a device structure. The device structure can comprise, as illustrated in FIG. 2(a) and FIG. 3(a)-(c), one or more layers 204, 318, 334 on or above a semi-polar or non-polar GaN substrate 202, 316, 332 wherein the layers 318, 334 can be semi-polar or non-polar III-nitride buffer layers, and a doping concentration in the buffer layers 318, 334 is optimized such that a number of crystal defects in III-nitride device layers 320-328, 338-340 formed on or above the doped buffer layers 318, 334 is not higher than a number of crystal defects in III-nitride device layers formed on or above one or more undoped buffer layers.

The device can comprise an (AlInGaN) based semiconductor device comprising one or more (In,Al)GaN layers overlying a semi-polar or non-polar GaN substrate, wherein the (In,Al)GaN layers employ doping to influence or control crystal defects or extended defect morphology. One or more (AlInGaN) device layers can be on or above and/or below the (In,Al)GaN layers. The thickness and/or composition of the (In,Al)GaN layers overlying the semi-polar or non-polar GaN substrate can be (e.g., high enough) such that the device structure or the (In,Al)GaN layers are near or greater than their critical thickness for relaxation.

The device structure can be an LED, LD, or solar cell device structure as shown in FIGS. 3(a)-3(c). For example, the device layers can be the layers of an LED (including an n-type layer, p-type layer, and active region), solar cell, or LD. The device layers of an LD can include cladding layers, waveguiding layers and an active region. The device layers can also be the layers of an electronic device such as a transistor.

Nomenclature

The terms "(AlInGaN)" "(In,Al)GaN", or "GaN" as used herein (as well as the terms "III-nitride," "Group-III nitride", or "nitride," used generally) refer to any alloy composition of the (Ga,Al,In,B)N semiconductors having the formula $Ga_wAl_xIn_yB_zN$ where $0 \le w \le 1$, $0 \le x \le 1$, $0 \le y \le 1$, $0 \le z \le 1$, and $w+x+y+z=1$. These terms are intended to be broadly construed to include respective nitrides of the single species, Ga, Al, In and B, as well as binary, ternary and quaternary compositions of such Group III metal species. Accordingly, it will be appreciated that the discussion of the invention hereinafter in reference to GaN and InGaN materials is applicable to the formation of various other (Ga,Al,In,B)N material species. Further, (Ga,Al,In,B)N materials within the scope of the invention may further include minor quantities of dopants and/or other impurity or inclusional materials.

Many (Ga,Al,In,B)N devices are grown along the polar c-plane of the crystal, although this results in an undesirable quantum-confined Stark effect (QCSE), due to the existence of strong piezoelectric and spontaneous polarizations. One approach to decreasing polarization effects in (Ga,Al,In,B)N devices is to grow the devices on nonpolar or semipolar planes of the crystal.

The term "nonpolar plane" includes the {11-20} planes, known collectively as a-planes, and the {10-10} planes, known collectively as m-planes. Such planes contain equal numbers of Group-III (e.g., gallium) and nitrogen atoms per plane and are charge-neutral. Subsequent nonpolar layers are equivalent to one another, so the bulk crystal will not be polarized along the growth direction.

The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero 1 Miller index. Subsequent semipolar layers are equivalent to one another, so the crystal will have reduced polarization along the growth direction.

REFERENCES

The following references are incorporated by reference herein:

1. A. Tyagi, F. Wu, E. C. Young, A. Chakraborty, H. Ohta, R. Bhat, K. Fujito, S. P. DenBaars, S. Nakamura and J. S. Speck, Appl. Phys. Lett. 95 251905 (2009).
2. E. C. Young, C. S. Gallinat, A. E. Romanov, A. Tyagi, F. Wu and J. S. Speck, Appl. Phys. Express 3 111002 (2010).
3. J. Matthews and A. Blakeslee, J. Cryst. Growth 32 265 (1976).

CONCLUSION

This concludes the description of the preferred embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a Group III-nitride based semiconductor device, comprising:
    (a) growing one or more buffer layers on or above a semi-polar or non-polar GaN substrate, wherein the buffer layers are semi-polar or non-polar Group III-nitride buffer layers; and
    (b) doping the buffer layers so that a number of crystal defects in Group III-nitride device layers formed on or above the doped buffer layers is not higher than a number of crystal defects in Group III-nitride device layers formed on or above one or more undoped buffer layers.

2. The method of claim 1, wherein the buffer layers are doped with a doping concentration of more than $3 \times 10^{18}$ cm$^{-3}$.

3. The method of claim 1, wherein the buffer layers are doped with Silicon (Si).

4. The method of claim 1, further comprising forming one or more Group III-nitride device layers above the buffer layers.

5. The method of claim 1, wherein the Group III-nitride device layers are coherently grown on or above the doped buffer layers.

6. The method of claim 1, wherein one or more of the Group III-nitride device layers formed on or above the doped buffer layers, including an active region, have a threading dislocation density of $10^7$ cm$^{-2}$ or less.

7. The method of claim 6, wherein an indium composition of one or more of the Group III-nitride device layers formed on or above the doped buffer layers, including the active region, is at least 30%, or sufficient for the device to emit light having a peak intensity at a wavelength in a green wavelength range or longer.

8. The method of claim 7, wherein the Group III-nitride device layers formed on or above the doped buffer layers comprise one or more waveguiding layers or one or more cladding layers, or the one or more waveguiding layers and the one or more cladding layers.

9. The method of claim 1, wherein the doping reduces or prevents formation of misfit dislocations with line directions inclined with respect to an in-plane m- or a-direction of the Group III-nitride device layers formed on or above the doped buffer layers.

10. The method of claim 9, where the doping prevents formation of additional threading dislocations during growth of the buffer layers and the Group III-nitride device layers on or above the doped buffer layers.

11. The method of claim 1, wherein the doping reduces or prevents formation of misfit dislocation lines resulting from c-plane slip where the line direction is parallel to an in-plane m- or a-direction of the Group III-nitride device layers formed on or above the doped buffer layers.

12. The method of claim 1, wherein the doping and a thickness, a composition, or the thickness and the composition, of the doped buffer layers are such that the doped buffer layers have a thickness near or greater than their critical thickness for relaxation.

13. The method of claim 1, further comprising increasing or maximizing a critical thickness of the buffer layers by the doping, or wherein the doping is such that the critical thickness is thicker as compared to without the doping.

14. A device fabricated according to the method claim 1.

15. The method of claim 1, wherein the buffer layers comprise InGaN.

16. The method of claim 1, wherein the buffer layers comprise AlGaN.

17. A Group III-nitride based semiconductor device structure, comprising:
one or more buffer layers on or above a semi-polar or non-polar GaN substrate, wherein:
the buffer layers are semi-polar or non-polar Group III-nitride buffer layers, and
a doping concentration in the buffer layers is optimized such that a number of crystal defects in Group III-nitride device layers formed on or above the doped buffer layers is not higher than a number of crystal defects in Group III-nitride device layers formed on or above one or more undoped buffer layers.

18. The device structure of claim 17, wherein the doping concentration is more than $3 \times 10^{18}$ cm$^{-3}$.

19. The device structure of claim 17, wherein the buffer layers are doped with Silicon (Si).

20. The device structure of claim 17, further comprising one or more Group III-nitride device layers formed above the buffer layers.

21. The device structure of claim 17, wherein the Group III-nitride device layers are coherently grown on or above the doped buffer layers.

22. The device structure of claim 17, wherein one or more of the Group III-nitride device layers formed on or above the doped buffer layers, including an active region, have a threading dislocation density of $10^7$ cm$^{-2}$ or less.

23. The device structure of claim 22, wherein an indium composition of one or more of the Group III-nitride device layers formed on or above the doped buffer layers, including the active region, is at least 30% or sufficient for the device to emit light having a peak intensity at a wavelength in a green wavelength range or longer.

24. The device structure of claim 23, wherein the Group III-nitride device layers formed on or above the doped buffer layers comprise one or more waveguiding layers or one or more cladding layers, or the one or more waveguiding layers and the one or more cladding layers.

25. The device structure of claim 17, wherein the doping concentration reduces or prevents formation of misfit dislocations with line directions inclined with respect to an in-plane m- or a-direction of the Group III-nitride device layers formed on or above the doped buffer layers.

26. The device structure of claim 25, where the doping concentration prevents formation of additional threading dislocations in the Group III-nitride device layers on or above the doped buffer layers.

27. The device structure of claim 17, wherein the doping concentration reduces or prevents formation of misfit dislocation lines resulting from c-plane slip where the line direction is parallel to the in-plane m- or a-direction.

28. The device structure of claim 17, wherein the doping concentration and a thickness or composition of the doped buffer layers is such that the doped buffer layers are near or greater than their critical thickness for relaxation.

29. The device structure of claim 17, wherein the buffer layers comprise InGaN.

30. The device structure of claim 17, wherein the buffer layers comprise AlGaN.

31. The device structure of claim 17, wherein the Group III-nitride device layers formed on or above the doped buffer layers are the layers of a laser diode (LD), light emitting diode (LED), solar cell, or transistor.

32. The device structure of claim 17, wherein the Group III-nitride device layers formed on or above the doped buffer layers are layers of a laser diode, including cladding layers, waveguiding layers, and an active region.

* * * * *